(12) United States Patent
Yoon et al.

(10) Patent No.: US 8,264,022 B2
(45) Date of Patent: Sep. 11, 2012

(54) SEMICONDUCTOR DEVICE INCLUDING CONTACT PLUG AND ASSOCIATED METHODS

(75) Inventors: Jae-man Yoon, Hwaseong-si (KR); Gyo-young Jin, Seoul (KR); Hyeong-sun Hong, Seongnam-si (KR); Makoto Yoshida, Suwon-si (KR); Bong-soo Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 302 days.

(21) Appl. No.: 12/588,790

(22) Filed: Oct. 28, 2009

(65) Prior Publication Data

US 2010/0207241 A1   Aug. 19, 2010

(30) Foreign Application Priority Data

Feb. 16, 2009   (KR) .................. 10-2009-0012599

(51) Int. Cl.
*H01L 21/70* (2006.01)
*H01L 21/8246* (2006.01)
*H01L 27/22* (2006.01)

(52) U.S. Cl. ......... 257/295; 257/E21.304; 257/E21.552; 257/E21.577; 257/E21.645; 257/E21.646; 257/E21.665; 257/E27.005; 438/672; 438/238; 438/381; 438/700; 438/253

(58) Field of Classification Search .................. 257/296, 257/E21.657, E21.658, E21.66, E21.304, 257/E21.552, E21.577, E21.645, E21.646; 438/672, 238, 381, 700
See application file for complete search history.

(56) References Cited

U.S. PATENT DOCUMENTS

| 6,207,574 B1 * | 3/2001 | Lee ................. 438/703 |
| 6,225,211 B1 | 5/2001 | Tsui |
| 6,461,911 B2 * | 10/2002 | Ahn et al. .............. 438/253 |
| 6,788,570 B2 * | 9/2004 | Kim et al. .............. 365/171 |
| 6,974,986 B2 * | 12/2005 | Kim et al. .............. 257/296 |
| 7,217,618 B2 * | 5/2007 | Lee et al. .............. 438/253 |
| 7,713,873 B2 * | 5/2010 | Kim et al. .............. 438/672 |
| 8,089,801 B2 * | 1/2012 | Wang et al. .............. 365/149 |
| 2002/0105088 A1 * | 8/2002 | Yang et al. .............. 257/774 |
| 2004/0140492 A1 * | 7/2004 | Ooishi .............. 257/295 |
| 2006/0124979 A1 * | 6/2006 | Yun et al. .............. 257/296 |
| 2006/0211192 A1 * | 9/2006 | Cho et al. .............. 438/238 |
| 2011/0186923 A1 * | 8/2011 | Seo et al. .............. 257/330 |

FOREIGN PATENT DOCUMENTS

| KR | 10-2002-0004374 A | 1/2002 |
| KR | 10-2005-0002423 A | 1/2005 |

* cited by examiner

*Primary Examiner* — Zandra Smith
*Assistant Examiner* — Tsz Chiu
(74) *Attorney, Agent, or Firm* — Lee & Morse, P.C.

(57) ABSTRACT

A semiconductor device and associated methods, the semiconductor device including a semiconductor layer including a first region and a second region, a first contact plug disposed on the semiconductor layer and electrically connected to the first region, a second contact plug disposed on the semiconductor layer and electrically connected to the second region, a conductive layer electrically connected to the first contact plug, the conductive layer having a side surface and a bottom surface, and an insulating layer disposed between the conductive layer and the second contact plug so as to insulate the conductive layer from the second contact plug, the insulating layer facing the side surface and a portion of the bottom surface of the conductive layer.

11 Claims, 12 Drawing Sheets

SEMICONDUCTOR DEVICE INCLUDING CONTACT PLUG AND ASSOCIATED METHODS

BACKGROUND

1. Field

Embodiments relate to a semiconductor device including a contact plug and associated methods.

2. Description of the Related Art

An active region of a substrate in a semiconductor device may be electrically connected to another structure via a contact plug. Due to the small size of such semiconductor devices, research has been conducted into the formation of a reliable contact plug in a minute region. In this regard, the research has been conducted into a method of forming a self aligning contact (SAC) by which a bit line contact plug and a bit line may first be formed, and then a storage contact plug may be formed using a spacer, which may cover the bit line, as a mask.

SUMMARY

Embodiments are directed to a semiconductor device including a contact plug and associated methods, which substantially overcome one or more of the drawbacks, limitations, and/or disadvantages of the related art.

It is a feature of an embodiment to provide a semiconductor device including a contact plug capable of providing an excellent electrical contact with an active region of a substrate.

At least one of the above and other features and advantages may be realized by providing a semiconductor device including a semiconductor layer including a first region and a second region, a first contact plug disposed on the semiconductor layer and electrically connected to the first region, a second contact plug disposed on the semiconductor layer and electrically connected to the second region, a conductive layer electrically connected to the first contact plug, the conductive layer having a side surface and a bottom surface, and an insulating layer disposed between the conductive layer and the second contact plug so as to insulate the conductive layer from the second contact plug, the insulating layer facing the side surface and a portion of the bottom surface of the conductive layer.

The second contact plug may include a lower portion and an upper portion, and a cross-sectional area of the lower portion of the second contact plug may be greater than a cross-sectional area of the upper portion of the second contact plug.

The insulating layer may include a bottom surface and at least a portion of the second contact plug may face the bottom surface of the sidewall insulating layer.

The insulating layer may include a first side surface and a second side surface, the first side surface facing the second contact plug and having a first height, the second side surface facing away from the second contact plug and having a second height.

The first height may be greater than the second height.

The first contact plug may include a material different from a material in the second contact plug.

The first contact plug may include a material the same as a material in the second contact plug.

The first contact plug, the second contact plug, and the conductive layer may each independently include at least one of polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr).

The semiconductor device may further include an etch stopping layer interposed between the first contact plug and the first conductive layer.

The conductive layer may be a bit line, the first contact plug may be a bit line contact plug connected to the bit line, and the second contact plug may be a storage contact plug.

At least one of the above and other features and advantages may also be realized by providing a semiconductor device including a semiconductor layer including a plurality of active regions, a bit line contact plug disposed on the semiconductor layer and electrically connected to one of the plurality of active regions, a storage contact plug disposed on the semiconductor layer and electrically connected to another one of the plurality of active regions, a bit line electrically connected to the bit line contact plug, the bit line having a side surface and a bottom surface, a storage capacitor electrically connected to the storage contact plug, and an insulating layer disposed between the bit line and the storage contact plug so as to insulate the bit line from the storage contact plug, the insulating layer having a bottom surface, the insulating layer facing the side surface and a portion of the bottom surface of the bit line, at least a portion of the bottom surface of the insulating layer facing the storage contact plug.

At least one of the above and other features and advantages may also be realized by providing a method of manufacturing a semiconductor device including forming a first interlayer insulating layer on a semiconductor layer, forming a first contact plug in the first interlayer insulating layer, covering the first interlayer insulating layer with a second interlayer insulating layer, forming a second contact plug in the second interlayer insulating layer and the first interlayer insulating layer, forming a third interlayer insulating layer on the second interlayer insulating layer, patterning the third interlayer insulating layer, patterning a portion of the second interlayer insulating layer by using the patterned third interlayer insulating layer as an etch mask to form one opening, the one opening exposing at least a portion of the second contact plug, forming another opening by etching the portion of the second contact plug exposed by the one opening, forming a sidewall insulating layer in the one opening and the other opening, and forming a conductive layer in the one opening.

The forming the conductive layer in the one opening may include filling at least a portion of the one opening with a conductive material.

The method may further include forming a fourth interlayer insulating layer on the conductive layer.

The first contact plug, the second contact plug, and the conductive layer may each be independently formed to include at least one of polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr).

The method may further include forming an etch stopping layer on the first interlayer insulating layer prior to covering the first interlayer insulating layer with the second interlayer insulating layer.

The forming the sidewall insulating layer may include fashioning the sidewall insulating layer to have a bottom surface, at least a portion of the bottom surface of the sidewall insulating layer facing the second contact plug.

BRIEF DESCRIPTION OF THE DRAWINGS

The above and other features and advantages will become more apparent to those of ordinary skill in the art by describing in detail exemplary embodiments with reference to the attached drawings, in which:

FIGS. 2A through 12A illustrate plan views of stages in a method of manufacturing the semiconductor device of FIG. 1; and FIGS. 2B through 12B illustrate cross-sectional views of stages in a method of manufacturing the semiconductor device of FIG. 1, which are respectively taken along the lines A-A' and B-B' of FIGS. 2A through 12A.

DETAILED DESCRIPTION

Figure 1:
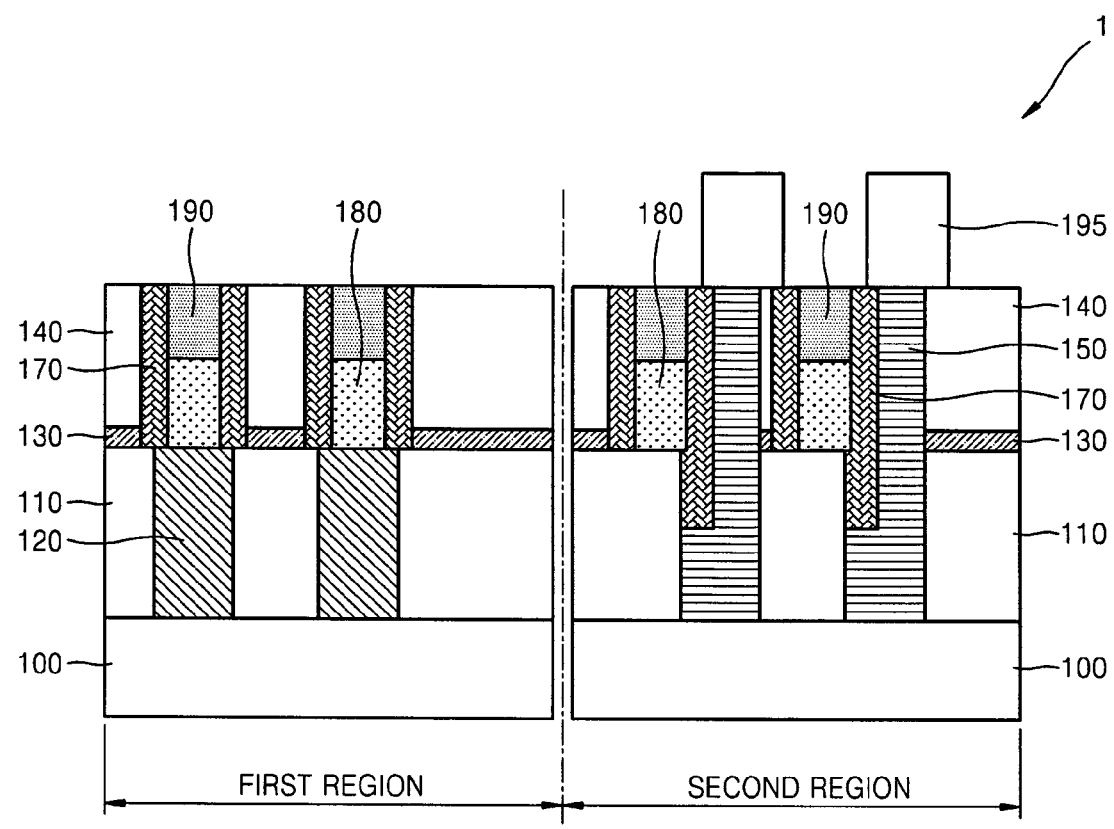
FIG. 1 illustrates a cross-sectional view of a semiconductor device including contact plugs according to an embodiment.

Korean Patent Application No. 10-2009-0012599, filed on Feb. 16, 2009, in the Korean Intellectual Property Office, and entitled: "Semiconductor Device Including Contact Plug," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element, such as a layer, a region, or a substrate, is referred to as being "connected to" or "coupled to" another element, it may be directly connected or coupled to the other element or intervening elements may be present. When an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a cross-sectional view of a semiconductor device 1 including contact plugs according to an embodiment. Referring to FIG. 1, a first interlayer insulating layer 110, an etch stopping layer 130, and a second interlayer insulating layer 140 may be sequentially disposed on a semiconductor layer 100 including a first region and a second region.

The semiconductor layer 100 may include a substrate including a semiconductor material, e.g., silicon and silicon-germanium, an epitaxial layer, a silicon-on-insulator (SOI) layer, and/or a semiconductor-on-insulator (SEOI) layer. The semiconductor layer 100 may include, e.g., a device isolation layer (not shown), an active region (not shown), and a gate structure (not shown). The active region (not shown) may include, e.g., a source/drain region (not shown) and/or a channel region (not shown). The gate structure (not shown) may be a general transistor and may include, e.g., a gate insulating layer, a gate electrode, a spacer, and a capping layer.

The first region will now be described. A first contact plug 120 may be disposed on the semiconductor layer 100, penetrating the first interlayer insulating layer 110. The first contact plug may be electrically connected to the first region of the semiconductor layer 100. A conductive layer 180 may be disposed on the first contact plug 120. A fourth interlayer insulating layer 190 may be disposed on the conductive layer 180. Although the etch stopping layer 130 is illustrated in FIG. 1 as being interposed between the first and second insulating layers 110 and 140, the etch stopping layer 130 may also be disposed between the conductive layer 180 and the first contact plug 120. A sidewall insulating layer 170 may be disposed between the second interlayer insulating layer 140 and the conductive layer 180, and between the second interlayer insulating layer 140 and the fourth interlayer insulating layer 190.

The conductive layer 180 may be a bit line and the first contact plug 120 may be a bit line contact plug connected to the bit line. Also, the first region may be the active region, that is, the source/drain region, and thus, the first contact plug 120 may be electrically connected to the source/drain region. However, the embodiments are not limited thereto.

The second region will now be described. The second contact plug 150 may be disposed on the semiconductor layer 100, penetrating the first interlayer insulating layer 110 and the second interlayer insulating layer 140. The second contact plug 150 may be electrically connected to the second region of the semiconductor layer 100. The sidewall insulating layer 170 may be disposed between the second contact plug 150 and at least a portion of the first interlayer insulating layer 110. In particular, the second contact plug 150 may extend under the sidewall insulating layer to face at least a portion of a bottom surface of the sidewall insulating layer 170. Also, the sidewall insulating layer 170 may face a portion of a side surface of the second contact plug 150 that extends above the first interlayer insulating layer 110. The conductive layer 180 may be disposed on the first interlayer insulating layer 110. Portions of a side surface and a bottom surface of the conductive layer 180 may face the sidewall insulating layer 170 so that the conductive layer 180 may be insulated by, e.g., being separated, from the second contact plug 150. Thus, the conductive layer 180 and the second contact plug 150 may be electrically insulated from one another due to the sidewall insulating layer 170. Also, another portion of the sidewall insulating layer 170 may contact both the conductive layer 180 and the second interlayer insulating layer 140.

The fourth interlayer insulating layer 190 may be disposed on the conductive layer 180. The fourth interlayer insulating layer 190 may be surrounded by the sidewall insulating layer 170. The sidewall insulating layer 170 may include a first side surface and a second side surface, wherein the first side surface faces the second contact plug 150 and has a first height, and the second side surface faces away from the second contact plug 150, contacts the second interlayer insulating layer 140, and has a second height. The first height may be greater than the second height. A storage capacitor 195 may be disposed on and electrically connected to the second contact plug 150.

The second region may be the active region, that is, the source/drain region, and thus, the second contact plug 150 may be electrically connected to the source/drain region. The second contact plug 150 may be a storage contact plug connected to the storage capacitor 195. However, the embodiments are not limited thereto.

The semiconductor device 1 according to the embodiment illustrated in FIG. 1 may be, e.g., a Dynamic Random Access Memory (DRAM) device. However, the embodiments are not limited thereto and the semiconductor device according to an embodiment may also be, e.g., a Static Random Access Memory (SRAM) device or a non-volatile memory device.

FIGS. 2A through 12A illustrate plan views of stages in a method of manufacturing the semiconductor device of FIG. 1. FIGS. 2B through 12B illustrate cross-sectional views of stages in a method of manufacturing the semiconductor device of FIG. 1, which are respectively taken along the lines A-A' and B-B' of FIGS. 2A through 12A. In other words, FIGS. 2B, 3B, 4B, 5B, 6B, 7B, 8B, 9B, 10B, 11B, and 12B are cross-sectional views of the semiconductor device, taken along lines A-A' and B-B' of FIGS. 2A, 3A, 4A, 5A, 6A, 7A, 8A, 9A, 10A, 11A, and 12A, respectively. The cross-sectional view taken along the line A-A' corresponds to the first region and the cross-sectional view taken along the line B-B' corresponds to the second region.

Figure 2A:
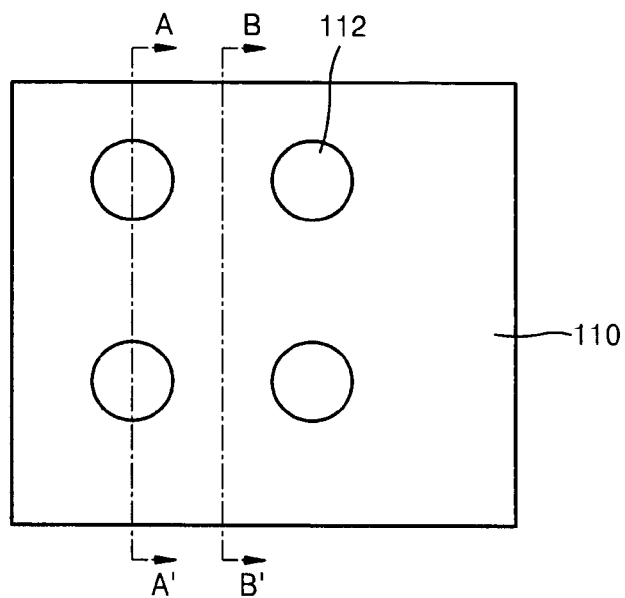
Figure 2B:
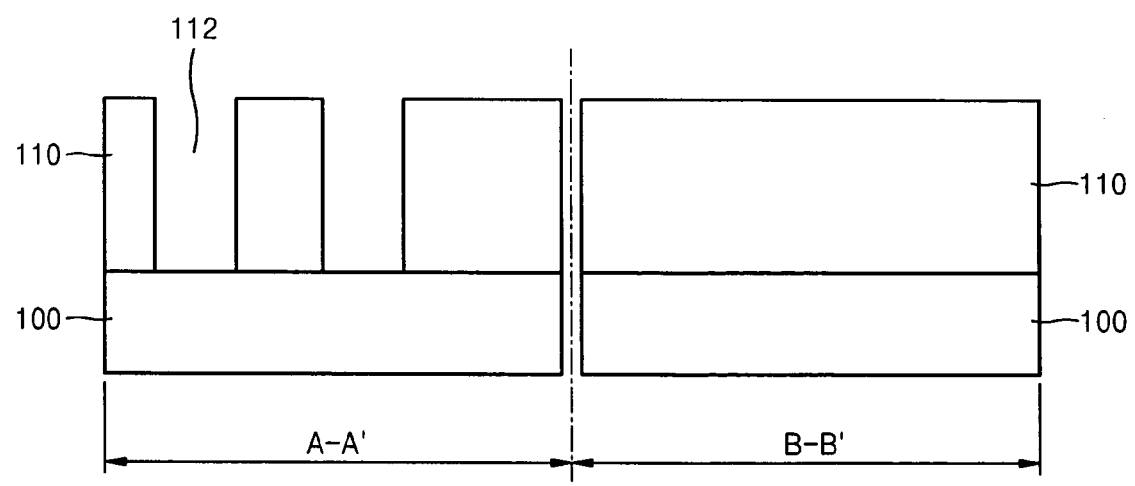

Referring to FIGS. 2A and 2B, a semiconductor layer 100 may be prepared. A buffer insulating layer (not shown) including, e.g., a silicon oxide, may be formed on the semiconductor layer 100. A hard mask layer including, e.g., polysilicon or a silicon nitride, may be formed on the semiconductor layer 100 or the buffer insulating layer. Detailed descriptions of layers such as a sacrificial layer, a buffer layer, a pad layer, and a hard mask layer that are formed by deposition and removed by etching so as to form the semiconductor device are not provided here.

A first interlayer insulating layer 110 may be formed on the semiconductor layer 100. The first interlayer insulating layer 110 may include, e.g., a silicon oxide, a silicon nitride, or a silicon oxynitride. The first interlayer insulating layer 110 may be formed by, e.g., thermal oxidation, rapid thermal oxidation (RTO), chemical vapor deposition (CVD), plasma enhanced CVD (PECVD), high density plasma CVD (HDP-CVD), sputtering, atomic layer deposition (ALD), or the like.

Then, a portion of the first interlayer insulating layer 110 may be patterned to form first openings 112 in the first interlayer insulating layer 110, exposing the semiconductor layer 100. This patterning may be performed by a typical method using, e.g., a photoresist or a hard mask. An etching method used to form the first openings 112 may be, e.g., an anisotropic etching method including reactive ion etching (RIE) and plasma etching, or a sloped etching method, but the embodiments are not limited thereto.

Figure 3A:
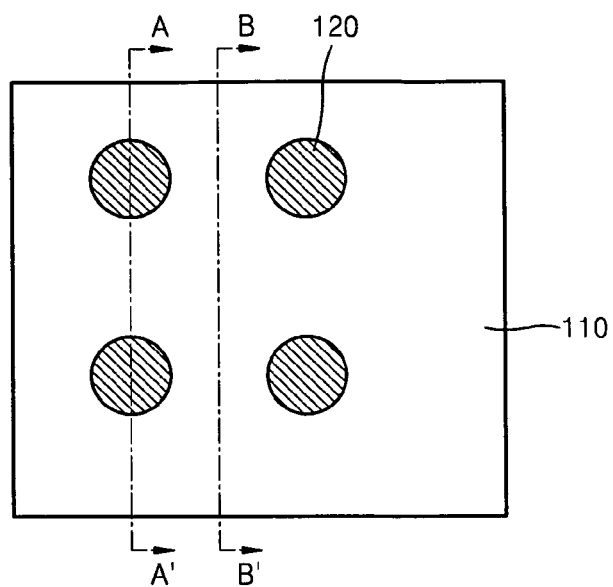
Figure 3B:
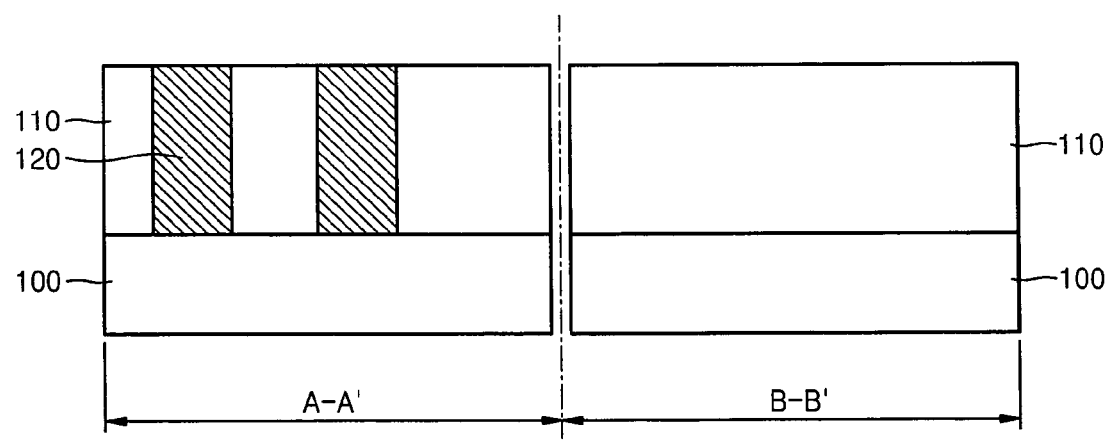

Referring to FIGS. 3A and 3B, the first openings 112 may be filled with a first conductive material, and thus, first contact plugs 120 (hereinafter, referred to as 'the first contact plug 120') may be formed. The first conductive material may include, e.g., polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and/or zirconium (Zr). The first conductive material may further include, e.g., a nitride or a silicide. If polysilicon is used, it may be doped with n-type impurities or p-type impurities. The first contact plug 120 may further include a barrier layer (not shown) for, e.g., lowering a potential barrier between contacts. The barrier layer may be a monolayer including, e.g., titanium (Ti), tantalum (Ta), or tungsten (W), or may be a multilayer including, e.g., titanium/titanium nitride (Ti/TiN), tantalum/tantalum nitride (Ta/TaN), or tungsten/tungsten nitride (W/WN). However, materials and layers included in the first contact plug 120 are not limited to the aforementioned materials and layers.

A planarization process including, e.g., an etch-back and/or chemical mechanical polishing (CMP), may be performed, so that an uppermost surface of the first contact plug 120 is the same level as an uppermost surface of the first interlayer insulating layer 110. The first contact plug 120 may be electrically connected to the active region of the semiconductor layer 100. The active region may be the source/drain region. Also, the first contact plug 120 may be electrically connected to a gate electrode of a gate structure included in the semiconductor layer 100.

Figure 4A:
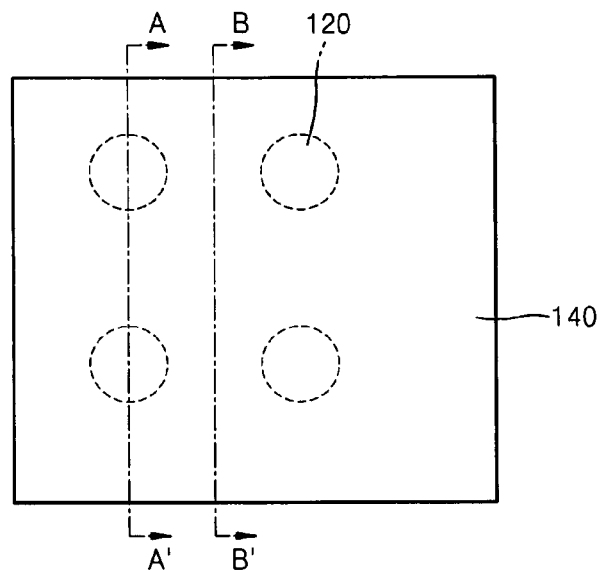
Figure 4B:
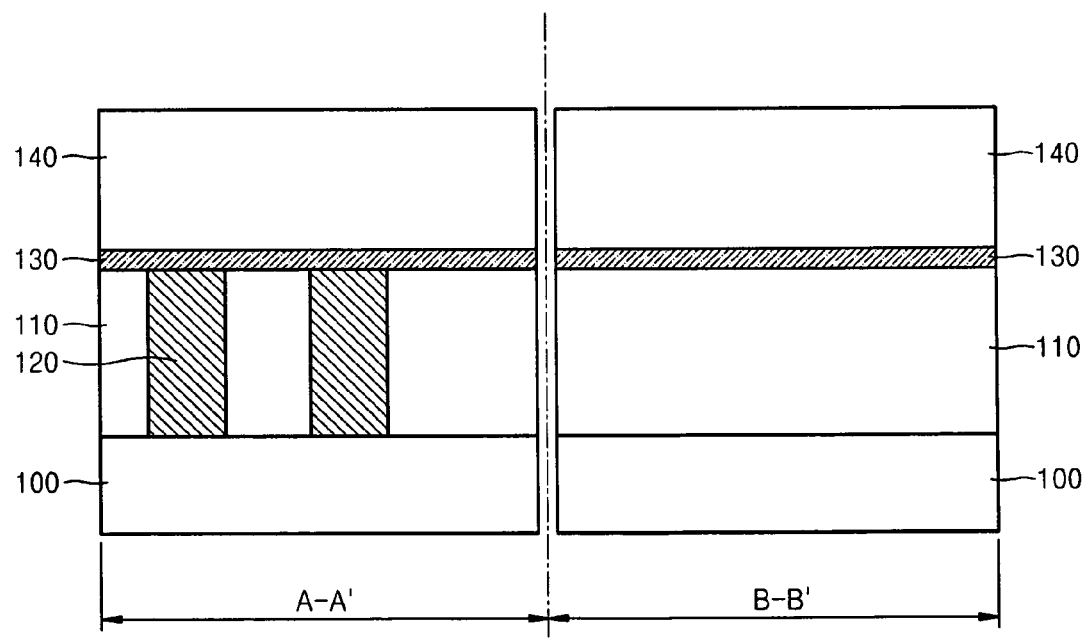

Referring to FIGS. 4A and 4B, an etch stopping layer 130 and a second interlayer insulating layer 140 may cover the first interlayer insulating layer 110 and the first contact plug 120. The etch stopping layer 130 may include, e.g., a silicon oxide, a silicon nitride, or a silicon oxynitride. In addition, the etch stopping layer 130 may include a material different from the first interlayer insulating layer 110. The second interlayer insulating layer 140 may include, e.g., a silicon oxide, a silicon nitride, or a silicon oxynitride. The second interlayer insulating layer 140 may include a material different from the etch stopping layer 130. The second interlayer insulating layer 140 may include the same material as the first interlayer insulating layer 110. Referring to FIG. 4A, the first contact plug 120 is denoted using a dotted line, meaning that other layers, e.g., the etch stopping layer 130 and the second interlayer insulating layer 140, are formed above the first contact plug 120.

Figure 5A:
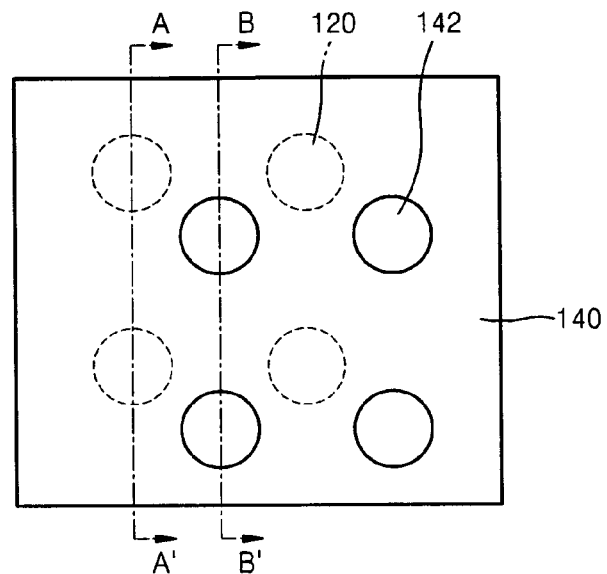
Figure 5B:
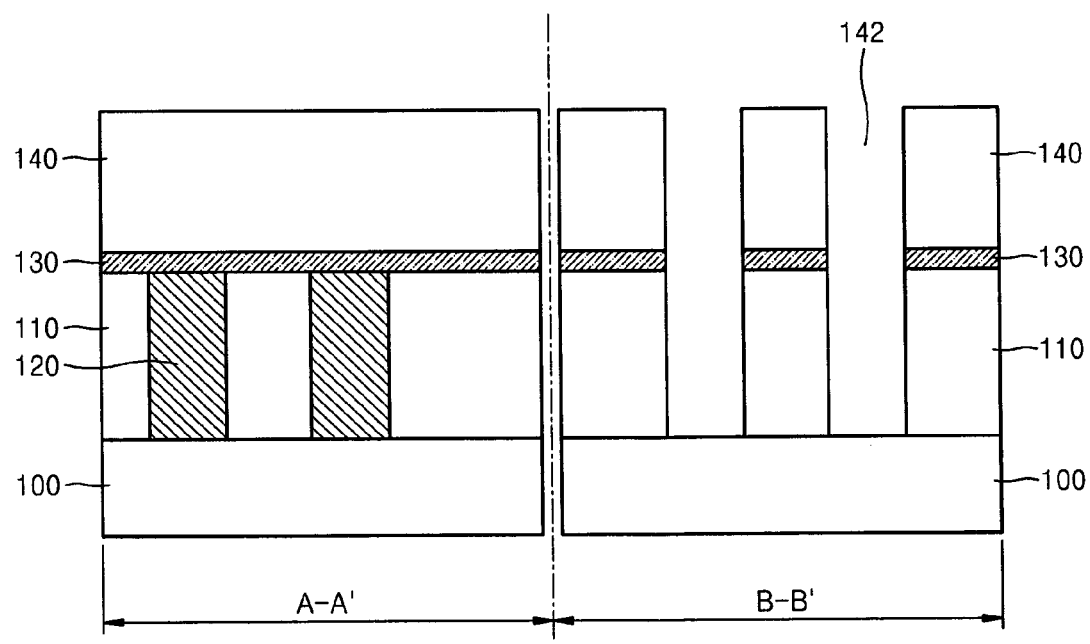

Referring to FIGS. 5A and 5B, portions of the second interlayer insulating layer 140, the etch stopping layer 130, and the first interlayer insulating layer 110 may be patterned to form second openings 142 exposing the semiconductor layer 100 through the second interlayer insulating layer 140, the etch stopping layer 130, and the first interlayer insulating layer 110. This patterning operation may be performed according to a typical method using, e.g., a photoresist or a hard mask. The second openings 142 may not contact the first contact plug 120. The embodiments are not limited to a specific alignment of the second openings 142 shown in FIG. 5A.

Figure 6A:
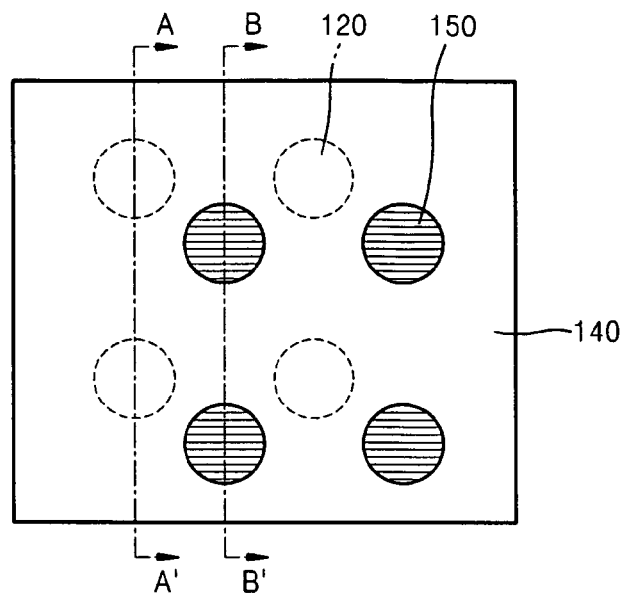
Figure 6B:
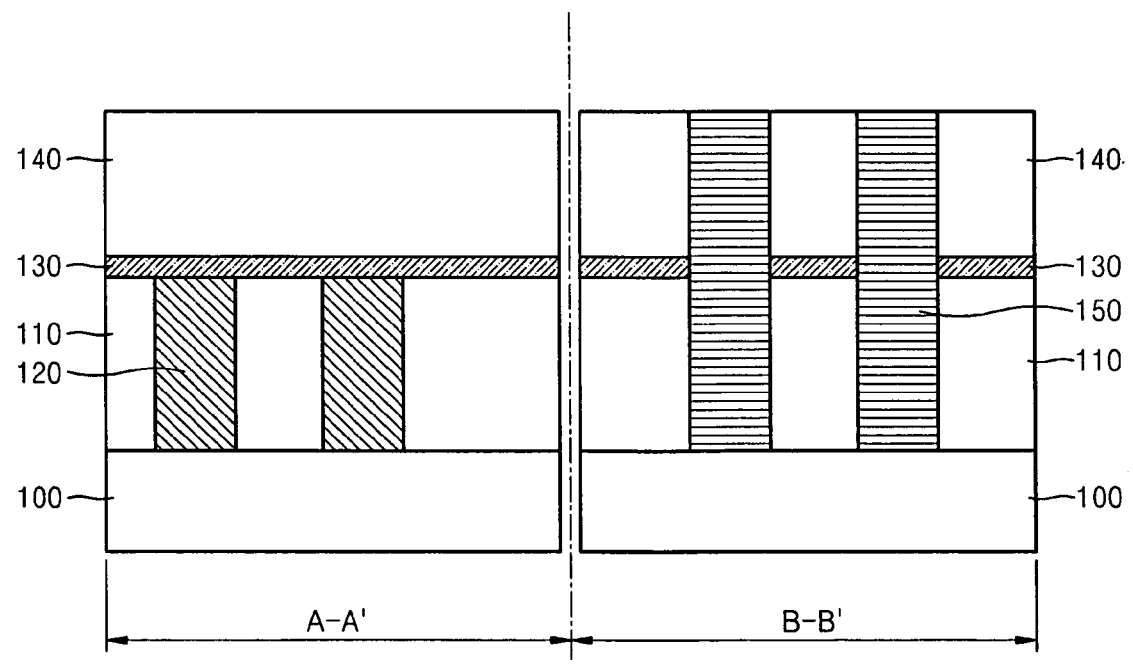

Referring to FIGS. 6A and 6B, the second openings 142 (hereinafter, referred to as "the second opening 142") may be filled with a second conductive material and thus, second contact plugs 150 (hereinafter, referred to as "the second contact plug 150") may be formed. The second conductive material may include, e.g., polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and/or zirconium (Zr). The second conductive material may further include, e.g., a nitride or silicide. If polysilicon is used, it may be doped with n-type impurities or p-type impurities. The second contact plug 150 may further include a barrier layer (not shown) for, e.g., lowering a potential barrier between contacts. The barrier layer may be a monolayer including, e.g., titanium (Ti), tantalum (Ta) or tungsten (W), or may be a multilayer including, e.g., titanium/titanium nitride (Ti/TiN), tantalum/tantalum nitride (Ta/TaN), or tungsten/tungsten nitride (W/WN). However, materials and layers included in the second contact plug 150 are not limited to the aforementioned materials and layers. The second conductive material of the second contact plug 150 may be to the same as or different from the first conductive material of the first contact plug 120.

A planarization process including, e.g., etch-back and/or CMP, may be performed, so that an uppermost surface of the second contact plug 150 is the same level as an uppermost surface of the second interlayer insulating layer 140. The second contact plug 150 may be electrically connected to the active region of the semiconductor layer 100. The active region may be the source/drain region. Also, the second contact plug 150 may be electrically connected to a gate electrode of a gate structure included in the semiconductor layer 100. Here, the active region to which the second contact plug 150 is electrically connected may be different from the active region to which the first contact plug 120 is electrically connected. That is, if the first contact plug 120 is electrically connected to the drain region of the source/drain region, the second contact plug 150 may be electrically connected to the source region of the source/drain region, or vice versa.

Figure 7A:
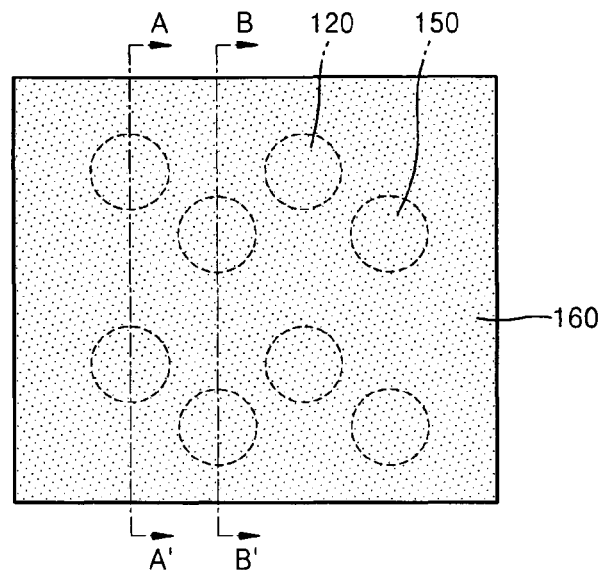
Figure 7B:
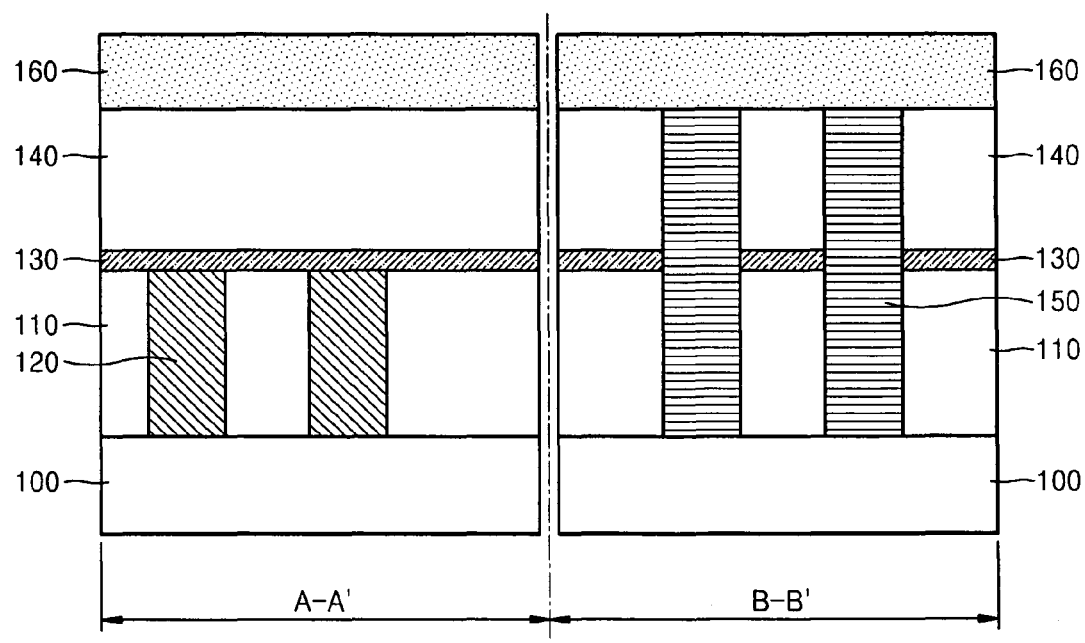

Referring to FIGS. 7A and 7B, a third interlayer insulating layer 160 may cover the second interlayer insulating layer 140 and the second contact plug 150. The third interlayer insulating layer 160 may serve as a hard mask, and may include, e.g., a silicon oxide, a silicon nitride, or a silicon oxynitride. The third interlayer insulating layer 160 may include a different material from the second interlayer insulating layer 140. Referring to FIG. 7A, the second contact plug 150 is also denoted using a dotted line, meaning that other layers including the third interlayer insulating layer 160 are formed above the second contact plug 150.

Figure 8A:
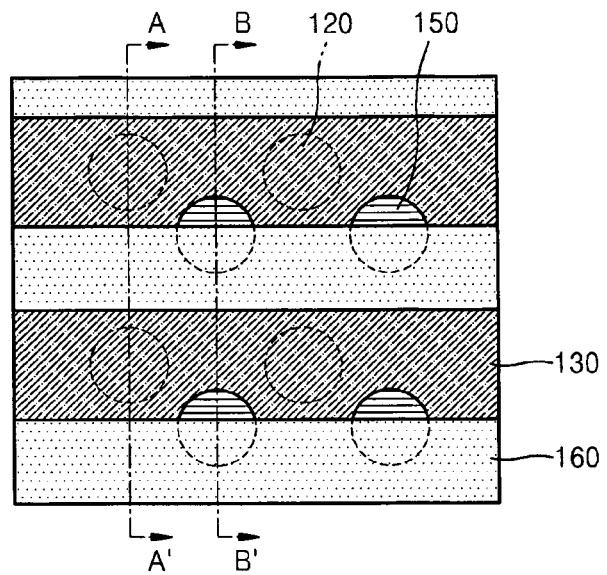
Figure 8B:
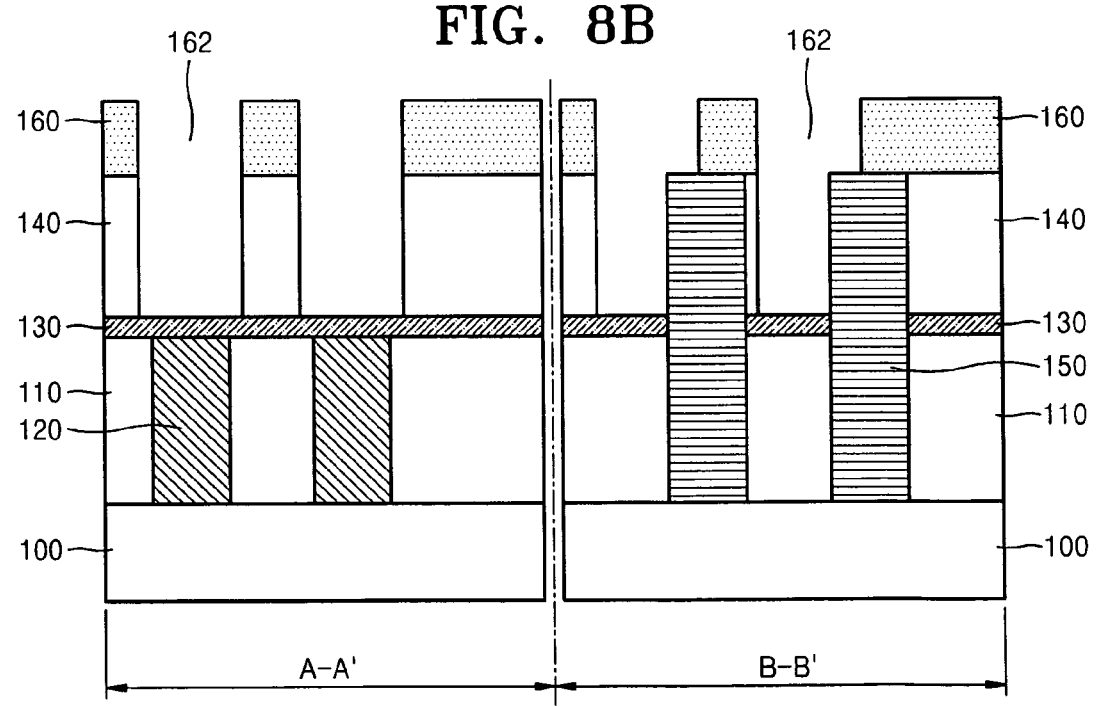

Referring to FIGS. 8A and 8B, the third interlayer insulating layer 160 may be patterned. Then, a portion of the second interlayer insulating layer 140 may be patterned using the third interlayer insulating layer 160 as an etch mask so that third openings 162 (hereinafter, referred to in the singular as one opening, i.e., as "the third opening 162") may be formed to expose portions of the etch stopping layer 130 and the second contact plug 150. In a region including the first contact plug 120, the third opening 162 may expose a portion of the etch stopping layer 130 and the second interlayer insulating layer 140 at a side portion thereof. In a region including the second contact plug 150, the third opening 162 may expose a portion of the etch stopping layer 130 at a lowermost portion thereof and the second interlayer insulating layer 140 at the side portion thereof. In addition, the third opening 162 may expose at least a portion of the second contact plug 150.

Figure 9A:
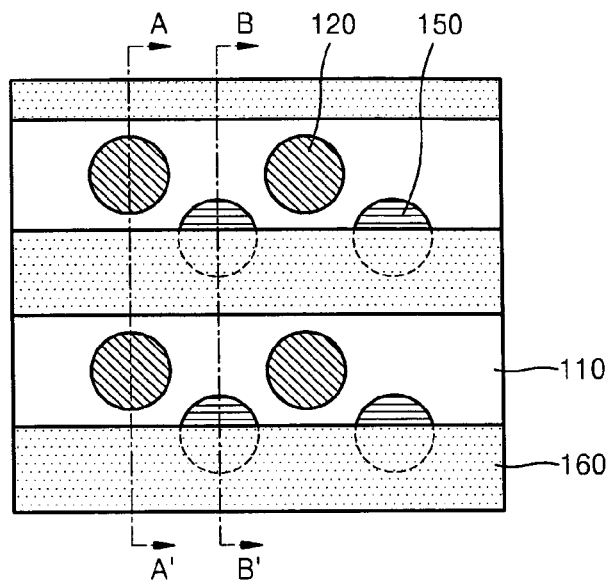
Figure 9B:
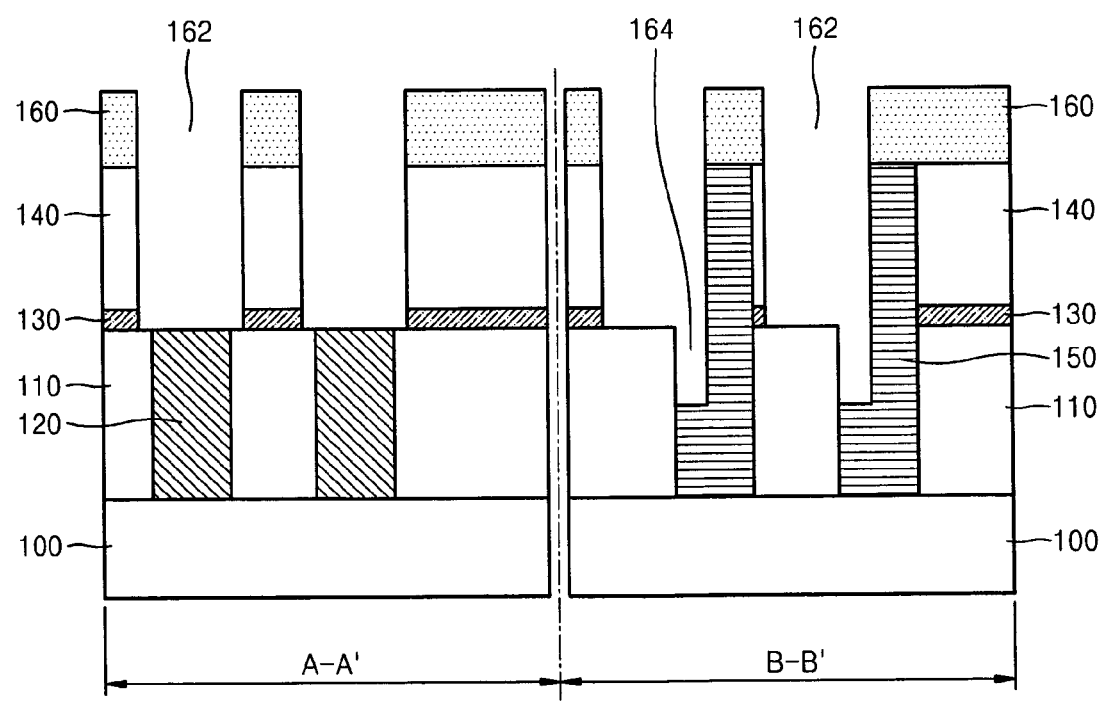

Referring to FIGS. 9A and 9B, the portion of the etch stopping layer 130 exposed by the third opening 162 may be removed to expose the first contact plug 120 under the etch stopping layer 130. In the case where the third interlayer insulating layer 160 includes the same material as the etch stopping layer 130, the third interlayer insulating layer 160 may be removed, or its height may be lowered in a process related to FIGS. 9A and 9B. Furthermore, a portion of the second contact plug 150 exposed by the third opening 162 may be further etched downwardly (that is, an over-etching) so that fourth openings 164 (hereinafter, referred to in the singular as another opening, i.e., as "the fourth opening 164") may be formed. The fourth opening 164 may be formed by using, e.g., an anisotropic dry etching method. Removal of portions of the second contact plug 150 may be controlled to prevent the fourth opening 164 from exposing the semiconductor layer 100.

Also, in the case where the first contact plug 120 and the second contact plug 150 include different materials, the first contact plug 120 may not be etched during the above-described over-etching process in which the fourth opening 164 is formed. For this, the first contact plug 120 may include a material having a high etching selectivity with respect to the material of second contact plug 150. However, in the case where the first contact plug 120 and the second contact plug 150 include the same material, the first contact plug 120 would be etched during the above-described over-etching process in which the fourth opening 164 is formed. Accordingly, the etch stopping layer 130 may remain on the first contact plug 120 during over etching of the second contact plug 150.

Figure 10A:
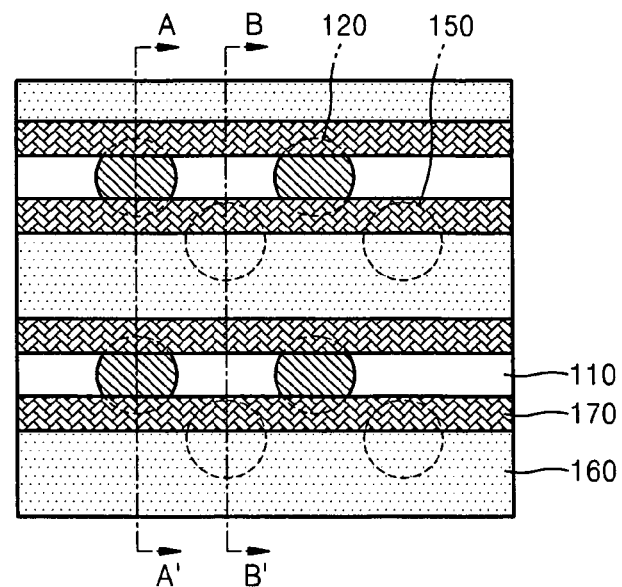
Figure 10B:
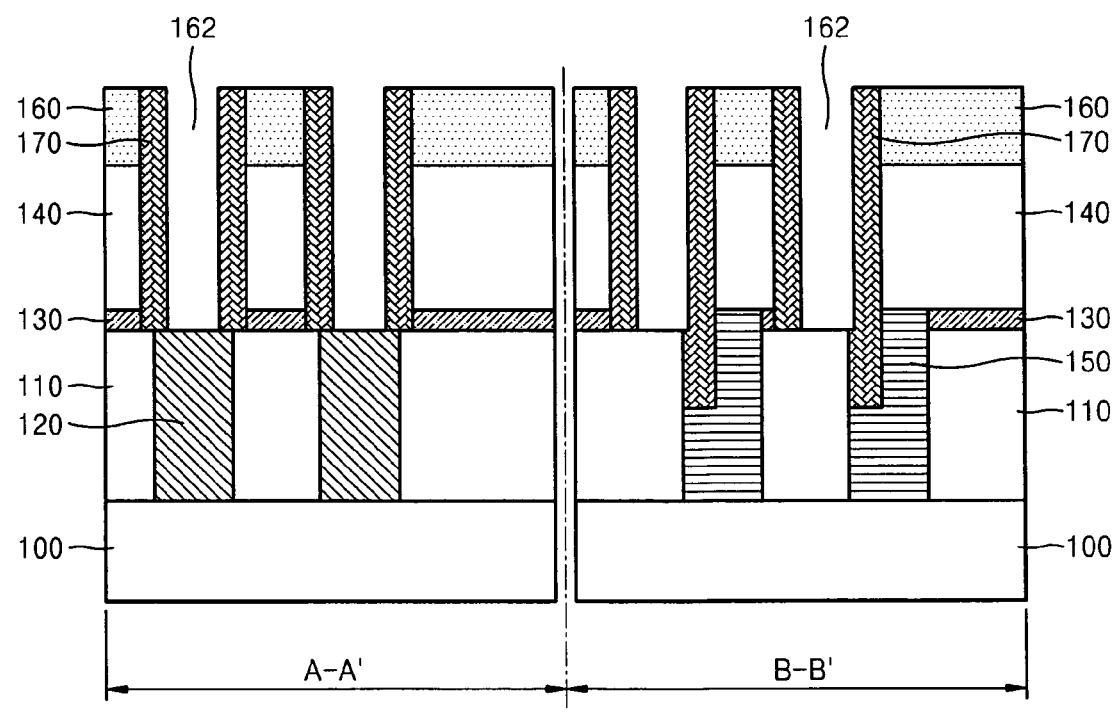

Referring to FIGS. 10A and 10B, the sidewall insulating layer 170 may be formed in the third opening 162 and the fourth opening 164. The sidewall insulating layer 170 may include, e.g., a silicon oxide, a silicon nitride, or a silicon oxynitride. The sidewall insulating layer 170 may be formed by using, e.g., CVD, Physical Vapor Deposition (PVD), or ALD, but the embodiments are not limited thereto. Thus, the sidewall insulating layer 170 may be formed by using any suitable deposition method. The sidewall insulating layer 170 may cover side walls in the third opening 162. That is, in the region including the first contact plug 120, the sidewall insulating layer 170 may cover side walls of the etch stopping layer 130, the second interlayer insulating layer 140, and/or the third interlayer insulating layer 160. In the region including the second contact plug 150, the sidewall insulating layer 170 may cover side walls of the etch stopping layer 130, the second interlayer insulating layer 140, the second contact plug 150, and/or the third interlayer insulating layer 160. Also, the sidewall insulating layer 170 may completely cover and/or fill the fourth opening 164 by covering side walls of the first interlayer insulating layer 110 and the second contact plug 150, which may be exposed by the fourth opening 164. In particular, the sidewall insulating layer 170 may be formed in such a manner that the sidewall insulating layer 170 may insulate the second contact plug 150 from a conductive layer (refer to reference numeral 180 of FIG. 11B) that is to be formed in a portion of the third opening 162 in a subsequent process. Thus, a lower portion of the second contact plug 150 may have a cross-sectional area larger than that of an upper portion of the second contact plug 150, wherein the sidewall insulating layer 170 may not contact the lower portion of the second contact plug 150, while the sidewall insulating layer 170 may contact the upper part of the second contact plug 150. By doing so, an area (that is, the cross-sectional area of the lower part of the second contact plug 150) contacting the active region of the substrate 100 may be relatively large. Thus, an electrical contact area may increase so that electrical resistance may decrease and the number of defects may be reduced. Otherwise, a typical second contact plug (e.g., a storage contact plug) formed according to a self-aligning method after a bit line is formed may have, e.g., a higher resistance and a greater number of defects.

Figure 11A:
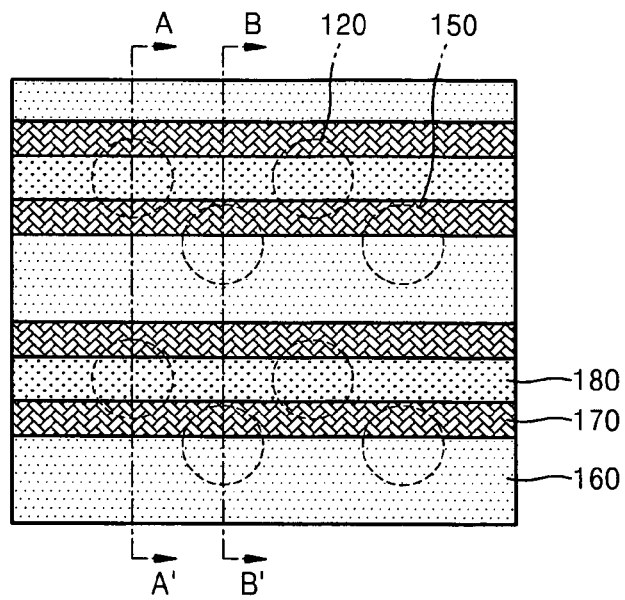
Figure 11B:
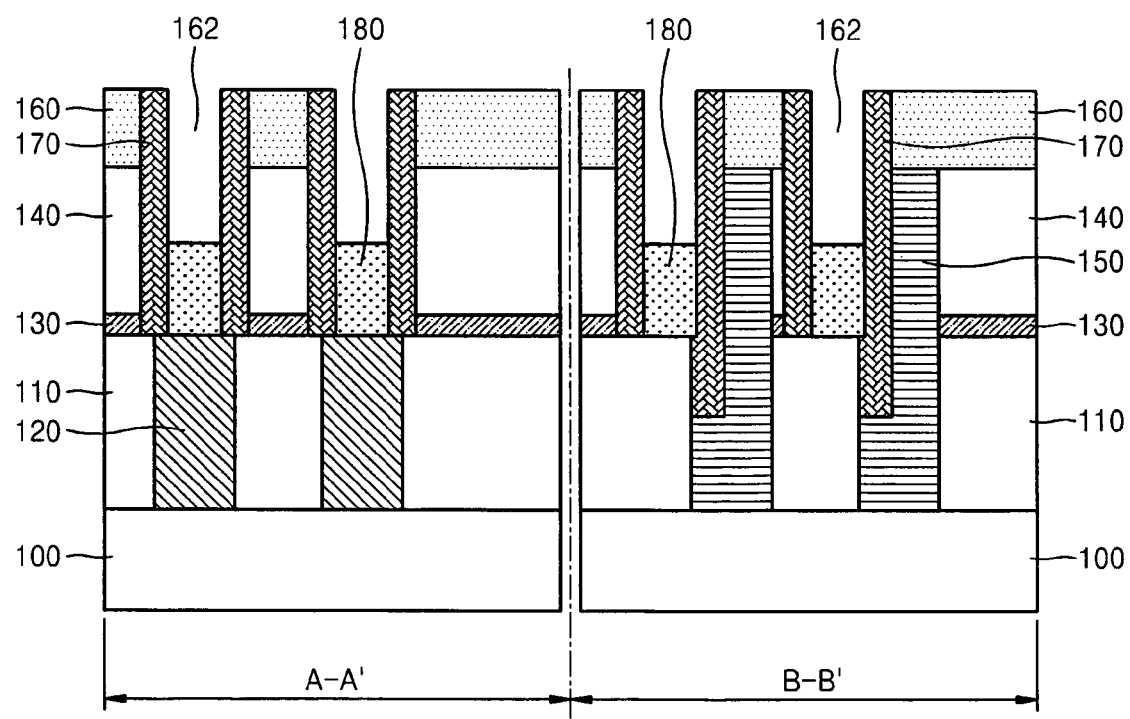

Referring to FIGS. 11A and 11B, a conductive layer 180 may be formed by filling at least a portion of the third opening 162 with a third conductive material. The third conductive material may include, e.g., polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and/or zirconium (Zr). The third conductive material may further include a nitride or silicide. If polysilicon is used, it may be doped with n-type impurities or p-type impurities. The conductive layer 180 may further include a barrier layer (not shown) to lower a potential barrier between contacts. The barrier layer may be a monolayer including, e.g., titanium (Ti), tantalum (Ta), or tungsten (W), or may be a multilayer including, e.g., titanium/titanium nitride (Ti/TiN), tantalum/tantalum nitride (Ta/TaN), or tungsten/tungsten nitride (W/WN). However, materials and layers included in the conductive layer 180 are not limited to the aforementioned materials and layers. The third conductive material may be the same as or different from the first conductive material and/or the second conductive material.

The conductive layer 180 may be formed by covering the third opening 162 with the conductive material and then performing a planarization process and an optional recess process. Alternatively, the conductive layer 180 may be formed by filling a portion of the area in the third opening 162 to a height lower than that of the second interlayer insulating layer 140. The conductive layer 180 may be electrically connected to the first contact plug 120. The conductive layer 180 may be electrically insulated from the second contact plug 150 by the sidewall insulating layer 170.

Figure 12A:
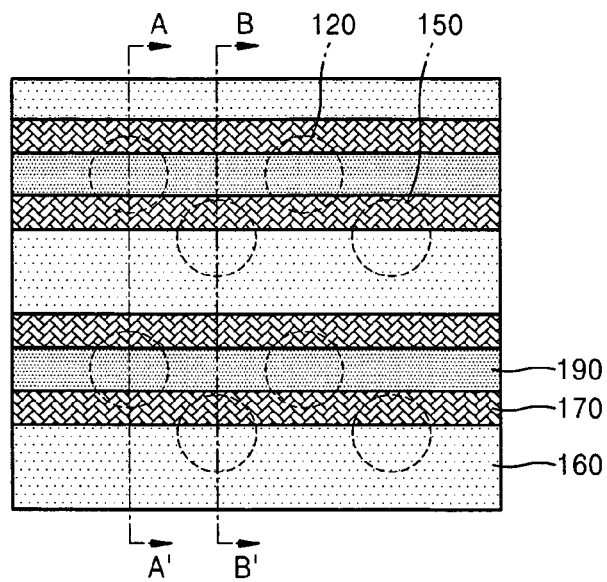
Figure 12B:
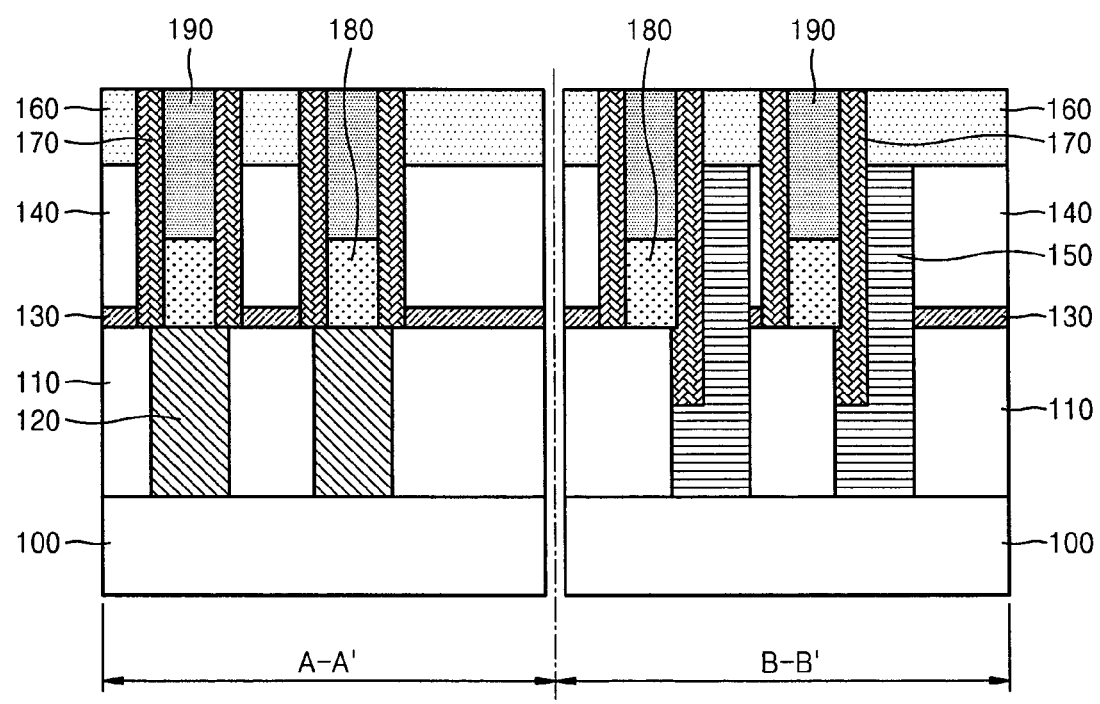

Referring to FIGS. 12A and 12B, a fourth interlayer insulating layer 190 may be formed on the conductive layer 180 so as to completely fill remaining portions of the third opening 162. The fourth interlayer insulating layer 190 may serve as a capping layer with respect to the conductive layer 180, and may include, e.g., a silicon oxide, a silicon nitride, or a silicon oxynitride. Also, the fourth interlayer insulating layer 190 may include the same material as or a different material from the third interlayer insulating layer 160.

Then, the third interlayer insulating layer 160 may be removed to expose, e.g., the second contact plug 150. The storage capacitor 195 (see FIG. 1) may be formed on the second contact plug 150, thereby completing the manufacture of the semiconductor device 1 of FIG. 1.

The method of manufacturing the semiconductor device according to the embodiment illustrated in FIGS. 2A through 12B may involve forming the first contact plug 120, including the first conductive material, in the first interlayer insulating layer 110 on the semiconductor layer 100; forming the second interlayer insulating layer 140 that covers the first interlayer insulating layer 110; forming the second contact plug 150 including the second conductive material in the second interlayer insulating layer 140 and the first interlayer insulating layer 110; forming the third interlayer insulating layer 160 on the second interlayer insulating layer 140; patterning a portion of the second interlayer insulating layer 140 by using the third interlayer insulating layer 160 as an etch mask, and thus forming the third opening 162 that exposes a portion of the second contact plug 150; forming the fourth opening 164 by additionally etching the portion of the second contact plug 150 exposed by the third opening 162 in a lower direction; forming the sidewall insulating layer 170 in the third opening 162 and the fourth opening 164; and forming the conductive layer 180 by filling at least a portion of an area in the third opening 162 with the third conductive material.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a semiconductor layer including a first region and a second region;
   a first contact plug disposed on the semiconductor layer and electrically connected to the first region;

a second contact plug disposed on the semiconductor layer and electrically connected to the second region;

a conductive layer electrically connected to the first contact plug, the conductive layer having a side surface and a bottom surface; and an insulating layer disposed between the conductive layer and the second contact plug so as to insulate the conductive layer from the second contact plug, the insulating layer facing the side surface and a portion of the bottom surface of the conductive layer, wherein:

the second contact plug includes a lower portion and an upper portion, the lower portion being between the upper portion and a surface of the semiconductor layer, and a cross-sectional area of the lower portion of the second contact plug is greater than a cross-sectional area of the upper portion of the second contact plug.

2. The semiconductor device as claimed in claim 1, wherein the insulating layer includes a bottom surface and wherein at least a portion of the second contact plug faces the bottom surface of the insulating layer.

3. The semiconductor device as claimed in claim 1, wherein the insulating layer includes a first side surface and a second side surface, the first side surface facing the second contact plug and having a first height, the second side surface facing away from the second contact plug and having a second height.

4. The semiconductor device as claimed in claim 3, wherein the first height is greater than the second height.

5. The semiconductor device as claimed in claim 1, wherein the first contact plug includes a material different from a material in the second contact plug.

6. The semiconductor device as claimed in claim 1, wherein the first contact plug includes a material the same as a material in the second contact plug.

7. The semiconductor device as claimed in claim 1, wherein the first contact plug, the second contact plug, and the conductive layer each independently include at least one of polysilicon, aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr).

8. The semiconductor device as claimed in claim 1, further comprising an etch stopping layer interposed between the first contact plug and the first conductive layer.

9. The semiconductor device as claimed in claim 1, wherein the conductive layer is a bit line, the first contact plug is a bit line contact plug connected to the bit line, and the second contact plug is a storage contact plug.

10. The semiconductor device as claimed in claim 1, wherein the insulating layer is directly between the upper portion of the second contact plug and the conductive layer.

11. A semiconductor device, comprising:

a semiconductor layer including a plurality of active regions;

a bit line contact plug disposed on the semiconductor layer and electrically connected to one of the plurality of active regions;

a storage contact plug disposed on the semiconductor layer and electrically connected to another one of the plurality of active regions;

a bit line electrically connected to the bit line contact plug, the bit line having a side surface and a bottom surface;

a storage capacitor electrically connected to the storage contact plug; and an insulating layer disposed between the bit line and the storage contact plug so as to insulate the bit line from the storage contact plug, the insulating layer having a bottom surface, the insulating layer facing the side surface and a portion of the bottom surface of the bit line, at least a portion of the bottom surface of the insulating layer facing the storage contact plug.

* * * * *